(12) United States Patent
Choo et al.

(10) Patent No.: US 8,963,153 B2
(45) Date of Patent: Feb. 24, 2015

(54) THIN FILM TRANSISTOR AND ORGANIC LIGHT EMITTING DISPLAY DEVICE HAVING THE SAME

(75) Inventors: Byoung-Kwon Choo, Yongin (KR); Kyu-Sik Cho, Yongin (KR); Won-Kyu Lee, Yongin (KR); Yong-Hwan Park, Yongin (KR); Sang-Ho Moon, Yongin (KR); Tae-Hoon Yang, Yongin (KR); Joon-Hoo Choi, Yongin (KR); Min-Chul Shin, Yongin (KR); Bo-Kyung Choi, Yongin (KR); Yun-Gyu Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 532 days.

(21) Appl. No.: 12/910,650

(22) Filed: Oct. 22, 2010

(65) Prior Publication Data

US 2011/0095296 A1  Apr. 28, 2011

(30) Foreign Application Priority Data

Oct. 27, 2009  (KR) .................. 10-2009-0102278

(51) Int. Cl.
*H01L 29/04* (2006.01)
*H01L 29/417* (2006.01)
*H01L 27/32* (2006.01)

(52) U.S. Cl.
CPC ...... *H01L 27/3262* (2013.01); *H01L 29/41733* (2013.01)
USPC .................................... 257/59; 257/E51.018

(58) Field of Classification Search
USPC ............. 257/59, 288, E51.018, E29.255
See application file for complete search history.

(56) References Cited

U.S. PATENT DOCUMENTS

| | | | | |
|---|---|---|---|---|
| 2007/0236424 | A1* | 10/2007 | Kimura ........................... | 345/76 |
| 2009/0152541 | A1* | 6/2009 | Maekawa et al. ............... | 257/43 |
| 2009/0184321 | A1* | 7/2009 | Tsai et al. ........................ | 257/66 |

FOREIGN PATENT DOCUMENTS

| | | | |
|---|---|---|---|
| KR | 1994-0008118 (A) | 4/1994 | |
| KR | 10-1999-024437 | 4/1999 | |
| KR | 10-2003-0065237 A | 8/2003 | |
| KR | 2003-0065237 | * 8/2003 | ........... H01L 29/762 |
| KR | 10-2007-0036832 | 9/2005 | |
| KR | 10-2008-0000546 | 1/2008 | |
| KR | 10-2008-0010865 (A) | 1/2008 | |
| KR | 10-2008-0076127 (A) | 8/2008 | |
| KR | 10-2008-0104756 A | 12/2008 | |

OTHER PUBLICATIONS

English translation: Kim et al., The switching thin film transistor, and the image input device using the same and manufacturing method thereof, Aug. 6, 2003, Korean Intellectual Property Office, pp. 1-24.*

(Continued)

*Primary Examiner* — Shaun Campbell
(74) *Attorney, Agent, or Firm* — Knobbe, Martens, Olson & Bear, LLP (57) ABSTRACT

A thin film transistor (TFT) and an organic light emitting display device having the same are disclosed. In one embodiment, a TFT includes a gate electrode formed on a substrate. A gate insulating layer is formed on the substrate having the gate electrode. An active layer is formed on the gate insulating layer. A source electrode is formed over the active layer. A drain electrode is formed to substantially surround at least three surfaces of the source electrode on the active layer.

18 Claims, 9 Drawing Sheets

(56) References Cited

OTHER PUBLICATIONS

Korean Office Action dated Oct. 20, 2011 for Korean Patent Application No. KR 10-2009-0102278 which corresponds to captioned U.S. Appl. No. 12/910,650.

Korean Notice of Allowance dated Dec. 1, 2011 for Korean Patent Application No. KR 10-2009-0102278 which corresponds to captioned U.S. Appl. No. 12/910,650.

Korean Office Action dated Feb. 23, 2011 for Korean Application No. KR 10-2009-0102278.

* cited by examiner

THIN FILM TRANSISTOR AND ORGANIC LIGHT EMITTING DISPLAY DEVICE HAVING THE SAME

RELATED APPLICATIONS

This application claims priority to and the benefit of Korean Patent Application No. 10-2009-0102278, filed on Oct. 27, 2009, in the Korean Intellectual Property Office, the entire content of which is incorporated herein by reference.

BACKGROUND

Field

An aspect of the present invention relates to a thin film transistor (TFT) and an organic light emitting display device having the same, and more particularly, to a TFT having a drain electrode formed to surround a source electrode and an organic light emitting display device having the same.

SUMMARY OF CERTAIN INVENTIVE ASPECTS

One aspect is a thin film transistor (TFT) having stable output current characteristics in a saturation region and an organic light emitting display device having the same.

Another aspect is a TFT having a high reliability and an organic light emitting display device having the same.

Another aspect is a TFT including a substrate; a gate electrode formed on the substrate; a gate insulating layer formed on the substrate having the gate electrode; an active layer formed on the gate insulating layer; a source electrode formed on the active layer; and a drain electrode formed to surround at least three surfaces of the source electrode on the active layer.

Another aspect is an organic light emitting display device including a first substrate having an organic light emitting element and a TFT formed thereon, the organic light emitting element having a first electrode, an organic light emitting layer and a second electrode, and the TFT controlling operations of the organic light emitting element; and a second substrate disposed opposite to the first substrate, wherein the TFT comprises: a gate electrode formed on the first substrate; a gate insulating layer formed on the first substrate having the gate electrode; an active layer formed on the gate insulating layer; a source electrode formed on the active layer; and a drain electrode formed to surround at least three surfaces of the source electrode on the active layer.

Another aspect is a thin film transistor (TFT) comprising: a substrate; a gate electrode formed on the substrate; a gate insulating layer formed on the substrate and the gate electrode; an active layer formed on the gate insulating layer; a source electrode formed over the active layer; and a drain electrode formed to substantially surround at least three surfaces of the source electrode on the active layer.

In the above TFT, the drain electrode has a "⊏", or "U" shape, and wherein the "⊏", or "U" shape surrounds a substantial portion of the source electrode. In the above TFT, the drain electrode comprises an edge portion, wherein the active layer comprises an edge portion, and wherein the edge portion of the drain electrode is substantially aligned with the edge portion of the active layer along a direction substantially perpendicular to the substrate. The above TFT further comprises a protection layer formed on the active layer. In the above TFT, the protection layer overlaps with the source electrode and at least a portion of the drain electrode. In the above TFT, the protection layer overlaps with an edge portion of the source electrode and an edge portion of the drain electrode. The above TFT further comprises an ohmic contact layer contacting and formed between the active layer and the drain electrode. In the above TFT, the ohmic contact layer is formed directly below the drain electrode. In the above TFT, the ohmic contact layer is formed directly below the source electrode. The above TFT further comprises a protection layer formed between the ohmic contact layer and the active layer. In the above TFT, the active layer is formed of low temperature poly-silicon (LTPS) crystallized using a solid phase crystallization (SPC) method.

Another aspect is an organic light emitting display device comprising: a first substrate comprising an organic light emitting element and a thin film transistor (TFT) formed thereon, wherein the organic light emitting element comprises i) first and second electrodes and ii) an organic light emitting layer interposed between the first and second electrodes, and wherein the TFT is configured to control operations of the organic light emitting element; and a second substrate disposed opposite to the first substrate, wherein the TFT comprises: a gate electrode formed on the first substrate; a gate insulating layer formed on the first substrate and the gate electrode; an active layer formed on the gate insulating layer; a source electrode formed over the active layer; and a drain electrode formed to substantially surround at least three surfaces of the source electrode on the active layer.

In the above organic light emitting display device, the drain electrode has a "⊏", or "U" shape, and wherein the "⊏", or "U" shape surrounds a substantial portion of the source electrode. In the above organic light emitting display device, the drain electrode comprises an edge portion, wherein the active layer comprises an edge portion, and wherein the edge portion of the drain electrode is substantially aligned with the edge portion of the active layer along a direction substantially perpendicular to the substrate. The above organic light emitting display device further comprises a protection layer formed on the active layer.

In the above organic light emitting display device, the protection layer overlaps with the source electrode and at least a portion of the drain electrode. In the above organic light emitting display device, the protection layer overlaps with an edge portion of the source electrode and an edge portion of the drain electrode. The above organic light emitting display device further comprising an ohmic contact layer formed between the active layer and the drain electrode.

Another aspect is an organic light emitting display device comprising: a first substrate; a second substrate disposed opposite to the first substrate; an organic light emitting element formed between the first and second substrates; a gate electrode formed over the first substrate; a gate insulating layer formed over the first substrate and the gate electrode; an active layer formed on the gate insulating layer; a source electrode formed over the active layer; and at least two drain electrodes spaced apart from the source electrode and formed on opposite sides of the source electrode, wherein at least one of the drain electrodes substantially surrounds at least three surfaces of the source electrode, and wherein two of the three surfaces are opposing each other.

The above organic light emitting display device further comprises: a planarization layer covering i) the source electrode, ii) the drain electrodes, iii) the active layer and iv) the gate insulating layer, wherein a via hole is defined in the planarization layer, and wherein the organic light emitting element is electrically connected to at least one of the drain electrodes through the via hole.

DETAILED DESCRIPTION OF CERTAIN INVENTIVE EMBODIMENTS

In a drive circuit such as an organic light emitting display device (OLED) or liquid crystal display device (LCD), the gray scale of an image is changed by output current characteristics in a saturation region of a thin film transistor (TFT). Hence, the output current characteristics are recognized as important electrical characteristics. If drain voltage is increased under constant gate voltage conditions, drain current is initially increased. However, the drain current is preferably maintained constant. When the voltage applied between source and drain electrodes is changed, the drain voltage of the TFT for driving a pixel is also changed, and therefore, image quality may be degraded by a change in luminance.

In a TFT, an active layer that provides a channel is usually formed of a semiconductor such as amorphous silicon or poly-silicon. Recently, a process has been developed in which an active layer is formed of low temperature poly-silicon (LTPS).

The LTPS is deposited and then crystallized using a method such as eximer laser annealing (ELA), sequential lateral solidification (SLS), super grain silicon (SGS) or solid phase crystallization (SPC), and hence, its durability is excellent. Thus, the LTPS is frequently used in a TFT for driving current. However, the LTPS has bad output current characteristics due to the current kink effect and the like. Particularly, if the LTPS is crystallized using the SPC method, which is advantageous in view of equipment operation and maintenance, short range uniformity is increased because the LTPS is crystallized without using laser. However, the LTPS crystallized using the SPC method has worse crystallinity than that crystallized using the ELA or SLS method, and therefore, its reliability is lowered. The bottom gate structure has weaker reliability for negative bias temperature stress than the top gate structure.

TFTs used in an OLED driven by current generally have more stable electrical characteristics and higher reliability than those used in an LCD driven by voltage.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 1A:
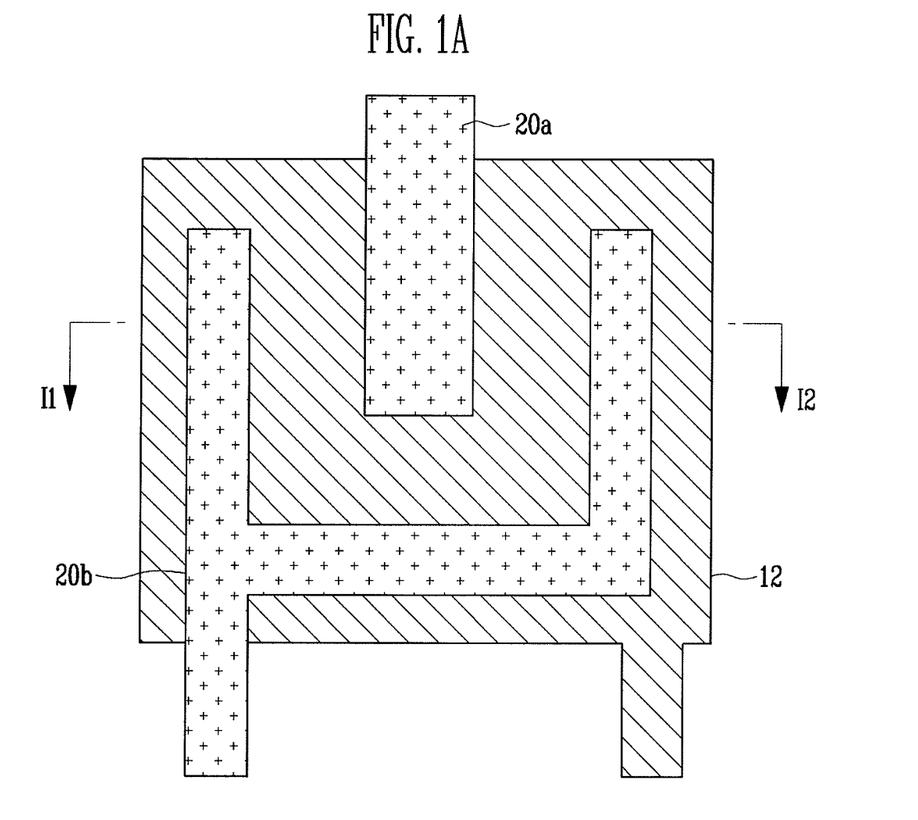
FIG. 1A is a layout of a thin film transistor (TFT) according to an embodiment of the present invention.
Figure 1B:
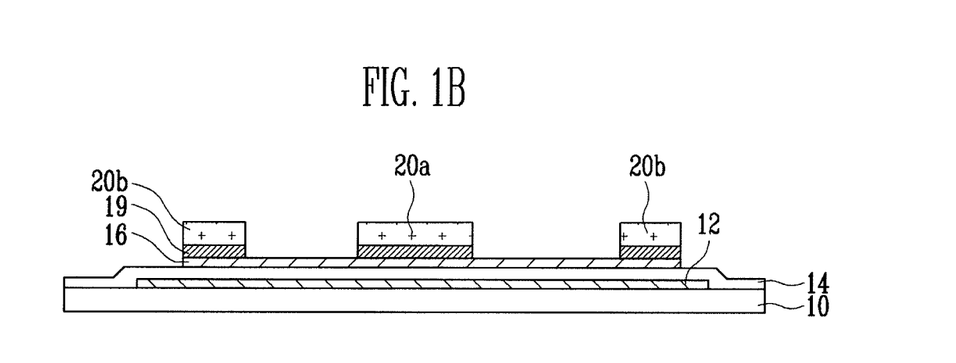
FIG. 1B is a sectional view taken along line I1-I2 of FIG. 1A.

FIG. 1A is a layout of a thin film transistor (TFT) according to an embodiment of the present invention. FIG. 1B is a sectional view taken along line I1-I2 of FIG. 1A.

Referring to FIGS. 1A and 1B, a gate electrode 12 may be formed on a substrate 10. The substrate 10 may be a semiconductor substrate such as silicon (Si), an insulating substrate such as glass or plastic, or a metal substrate. A buffer layer (not shown) may be formed on the substrate 10. In one embodiment, the gate electrode 12 is formed of a metal selected from the group consisting of tungsten (W), titanium (T), molybdenum (Mo), silver (Ag), tantalum (Ta), aluminum (Al), copper (Cu), gold (Au), chrome (Cr) and niobium (Nb), or alloy thereof.

In one embodiment, a gate insulating layer 14 is formed on the substrate 10 and the gate electrode 12, and an active layer 16 is formed on the gate insulating layer 14 above the gate electrode 12. The gate insulating layer 14 may be formed of silicon oxide (SiO), silicon nitride (SiN) or the like. The active layer 16 may be formed of amorphous silicon, poly-silicon or low temperature poly-silicon (LTPS). The active layer 16 may be crystallized using a method such as eximer laser annealing (ELA), sequential lateral solidification (SLS), super grain silicon (SGS) or solid phase crystallization (SPC), and may be doped with ions.

Figure 1C:
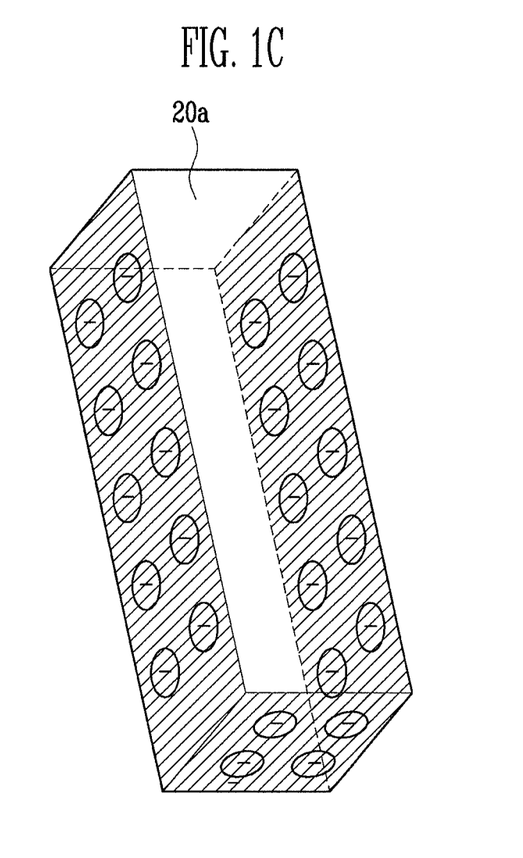
FIG. 1C is a three-dimensional view of the source electrode of the TFT which shows that electrons are arranged on the three surfaces of the source electrode.

In one embodiment, a source electrode 20a and a drain electrode 20b are formed on or over the active layer 16. In one embodiment, the drain electrode 20b is formed to surround at least three surfaces of the source electrode 20a, as shown in FIG. 1C. For example, the drain electrode 20b may be formed in a "⊏", or "U" shape, and the source electrode 20a may be formed into a structure in which it is inserted into an opening with the "⊏", or "U" shape. In one embodiment, the source and drain electrodes 20a and 20b are formed of a metal selected from the group consisting of tungsten (W), titanium (T), molybdenum (Mo), silver (Ag), tantalum (Ta), aluminum (Al), copper (Cu), gold (Au), chrome (Cr) and niobium (Nb), or alloy thereof.

The source and drain electrodes 20a and 20b may be formed by depositing the metal or alloy and then patterning it into the aforementioned structure. In the patterning process, if the active layer 16 formed below the drain electrode 20b is patterned using the drain electrode 20b as a mask, the number of masks may be reduced. In one embodiment, the outer surface of the drain electrode 20b corresponds to that of the active layer 16. In this embodiment, the width of the drain electrode 20b is substantially the same as that of the active layer 16, as shown in FIG. 1B.

An ohmic contact layer 19 may be formed between the active layer 16 and the source and drain electrodes 20a and 20b. In one embodiment, the ohmic contact layer 19 is used to decrease contact resistance between the active layer 16 and the source and drain electrodes 20a and 20b. The ohmic contact layer 19 may be formed of a metal or doped semiconductor.

Figure 2A:
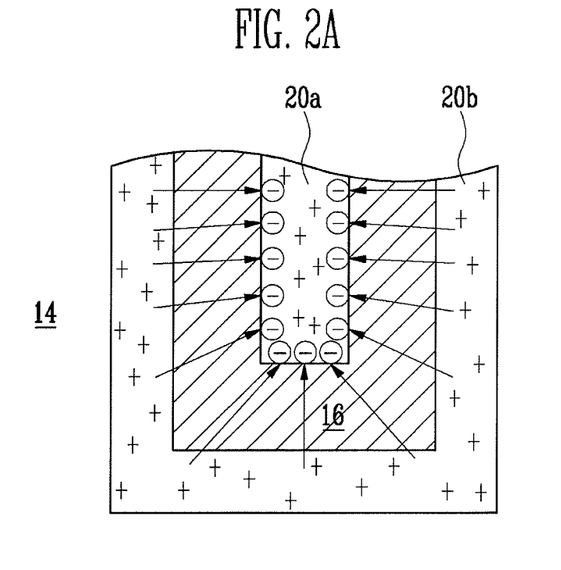
FIG. 2A is a conceptual view illustrating a TFT according to one embodiment of the present invention.
Figure 2B:
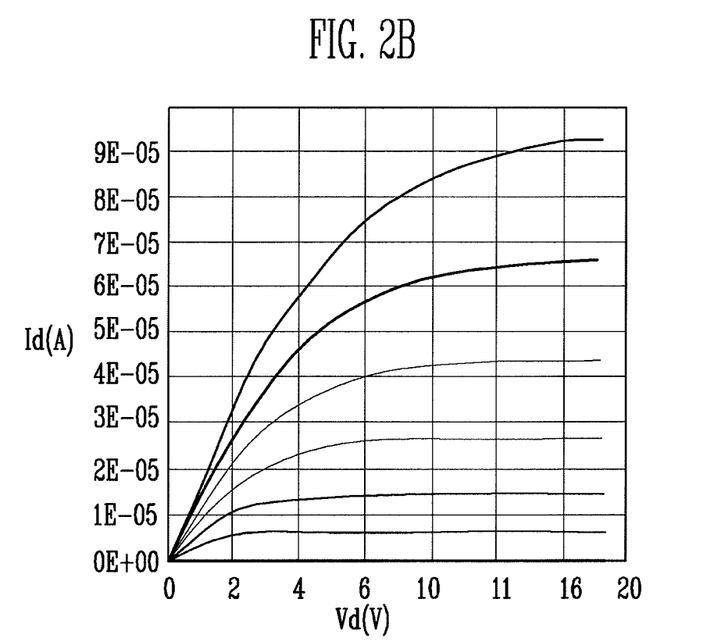
FIG. 2B is a graph illustrating changes in drain current Id with respect to drain voltage Vd according to one embodiment of the present invention.

In one embodiment, as shown in FIG. 2A, the drain electrode 20b is formed to surround at least three surfaces of the source electrode 20a. In this embodiment, since the area of surfaces of the drain electrode 20b opposite to the source electrode 20a is relatively broad, the number of electrons emitted from the drain electrode 20b is greater than that of electrons injected into the source electrode 20a (See FIG. 2A). On the other hand, since the area of surfaces of the source electrode 20a opposite to the drain electrode 20b is relatively narrow, the number of electrons injected into the source electrode 20a is restricted (See FIG. 2A). In one embodiment, as illustrated in FIG. 2B, if the drain voltage Vd is increased under a constant gate voltage condition, the drain current Id is initially increased at a rapid speed but is stably maintained constant in a saturation region.

Figure 3A:
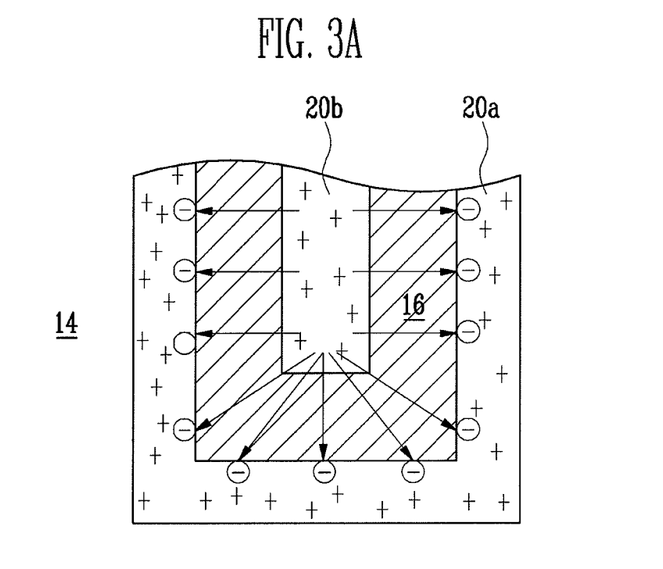
FIG. 3A is a conceptual view illustrating a TFT according to a comparative example.
Figure 3B:
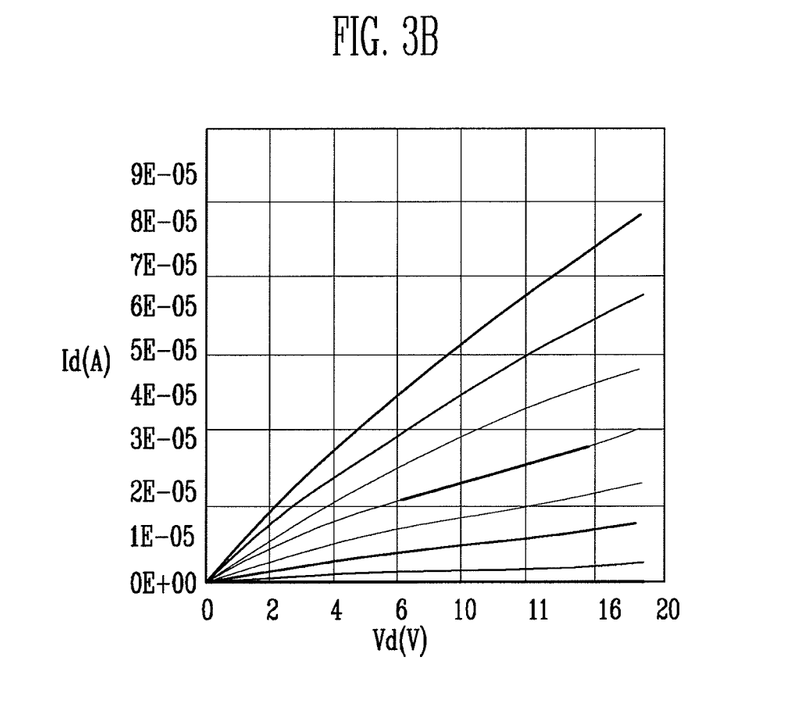
FIG. 3B is a graph illustrating changes in drain current Id with respect to drain voltage Vd according to a comparative example.

In contrast, in the TFT according to a comparative example, as shown in FIG. 3A, if the source electrode 20a is formed to surround at least three surfaces of the drain electrode 20b, the area of surfaces of the source electrode 20a opposite to the drain electrode 20b is relatively broad. In this situation, electrons emitted from the drain electrode 20b may be continuously injected into the source electrode 20a. As illustrated in FIG. 3B, if the drain voltage Vd is increased under a constant gate voltage condition, the drain current Id is continuously increased, and therefore, it is difficult to apply the aforementioned structure to a TFT.

In one embodiment, the TFT as shown in FIG. 2A has stable output current characteristics in the saturation region, based on the principle described above.

In one embodiment, as shown in FIG. 1A, the TFT has a structure in which the gate insulating layer 14 and the active layer 16 are interposed between the gate electrode 12 and the source and drain electrodes 20a and 20b. Hence, the electric field between the drain electrode 20b and the gate electrode 12 is decreased as compared with the structure in which the active layer is not interposed between the drain and gate electrodes. Further, the movement of electric charges injected into the gate insulating layer 14 by the electric field between the drain electrode 20b and the gate electrode 12 is blocked by the active layer 16. The electric field is decreased at surroundings of a channel region, which has no direct influence on characteristics of the TFT. According to the aforementioned structure, reliability for gate bias stress and constant current stress is improved.

Figure 4A:
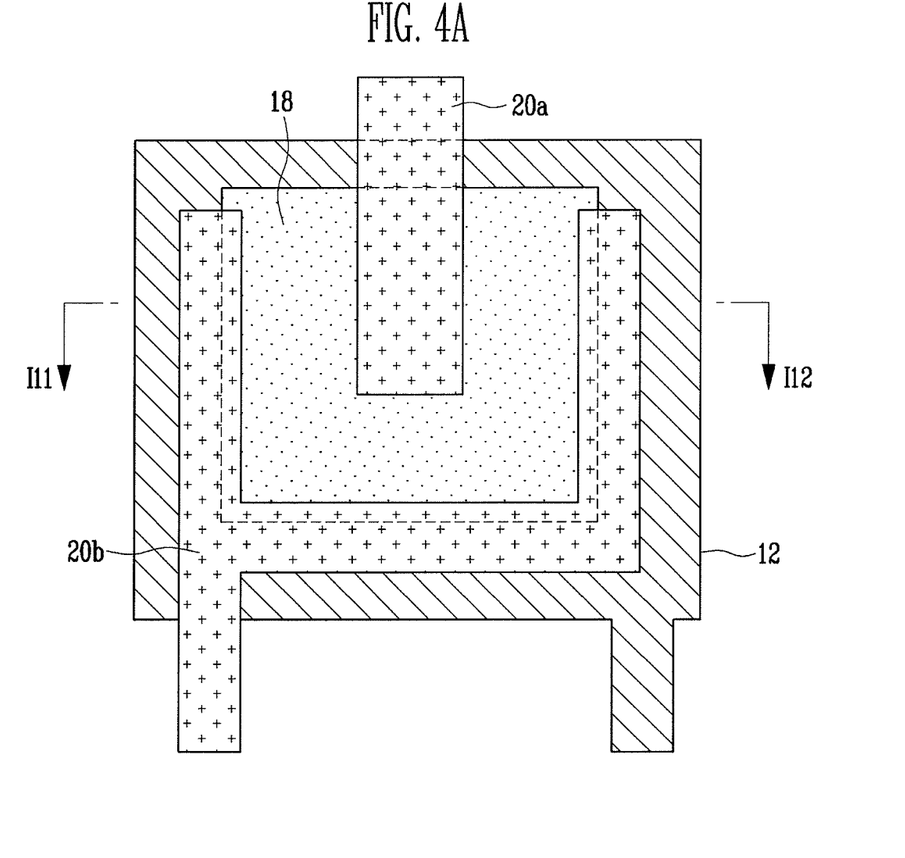
FIGS. 4A and 5A are layouts illustrating TFTs according to another embodiments of the present invention.
Figure 4B:
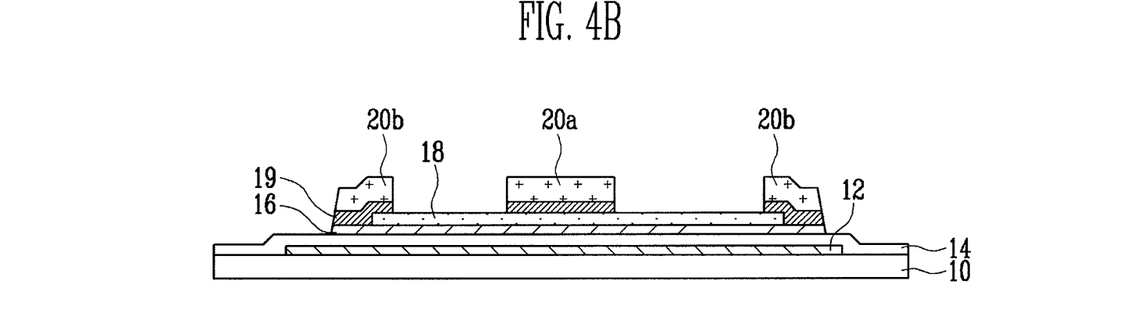
FIGS. 4B and 5B are sectional views taken along lines I1-I2 of FIGS. 4A and 5A, respectively.
Figure 5A:
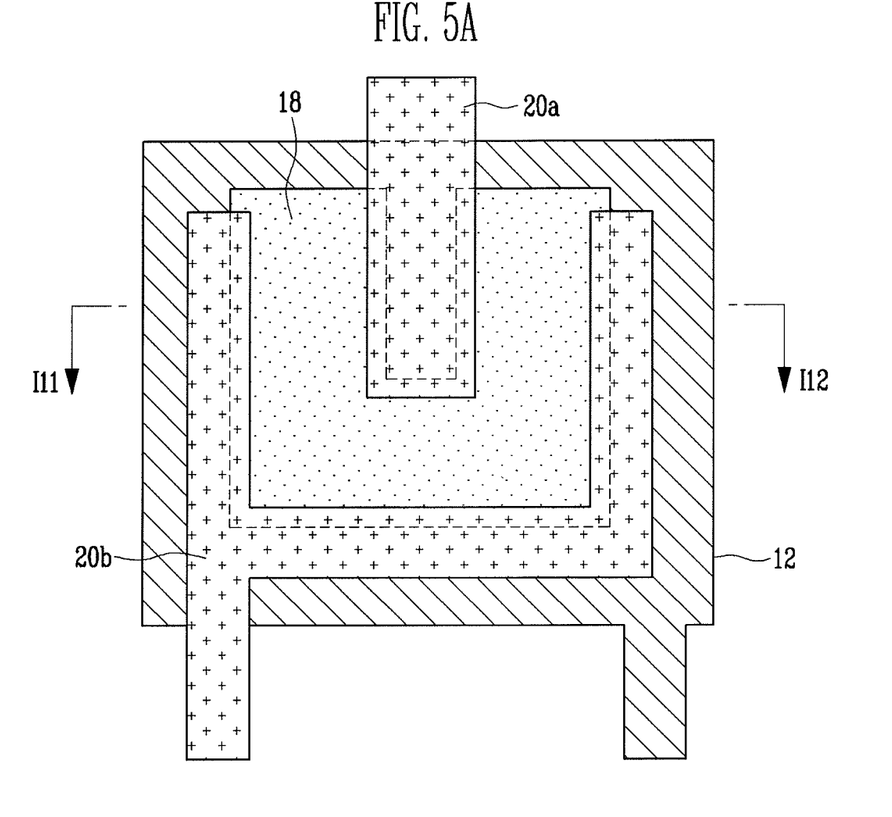
Figure 5B:
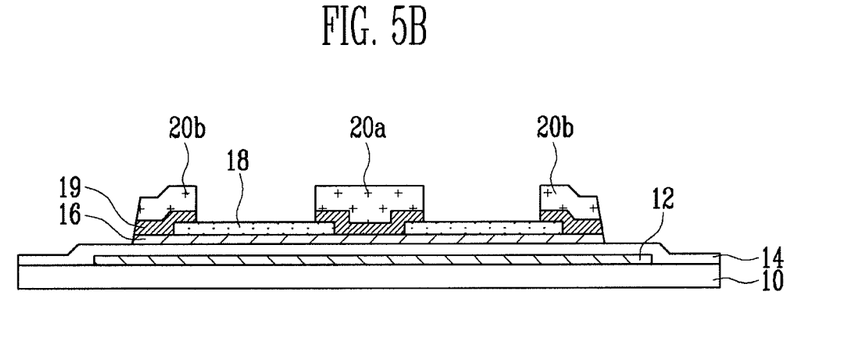

FIGS. 4A and 5A are layouts illustrating TFTs according to another embodiments of the present invention. FIGS. 4B and 5B are sectional views taken along lines I11-I12 of FIGS. 4A and 5A, respectively.

In one embodiment, as shown in FIGS. 4A and 5A embodiment, a protection layer 18 is formed on an active layer 16. In one embodiment, the protection layer 18 is used as an etch stop layer in an etching process for patterning source and drain electrodes 20a and 20b. Accordingly, in the etching process, it is possible to prevent surfaces of the active layer 16 from being damaged by plasma and to prevent electrical characteristics of the active layer 16 from being changed by contamination, thereby resulting in stable threshold voltage characteristics and reliability.

In one embodiment, as shown in FIGS. 4A and 4B, the protection layer 18 is formed on the active layer 16 and overlapped with the entire portion of the source electrode 20a and a portion of the drain electrode 20b. In another embodiment, as shown in FIGS. 5A and 5B, the protection layer 18 is formed on the active layer 16 and overlapped with an edge portion of the source electrode 20a and an edge portion of the drain electrode 20b. In this embodiment, the protection layer 18 is formed in a "⊏" or "U" shape, like the drain electrode 20b.

Figure 6:
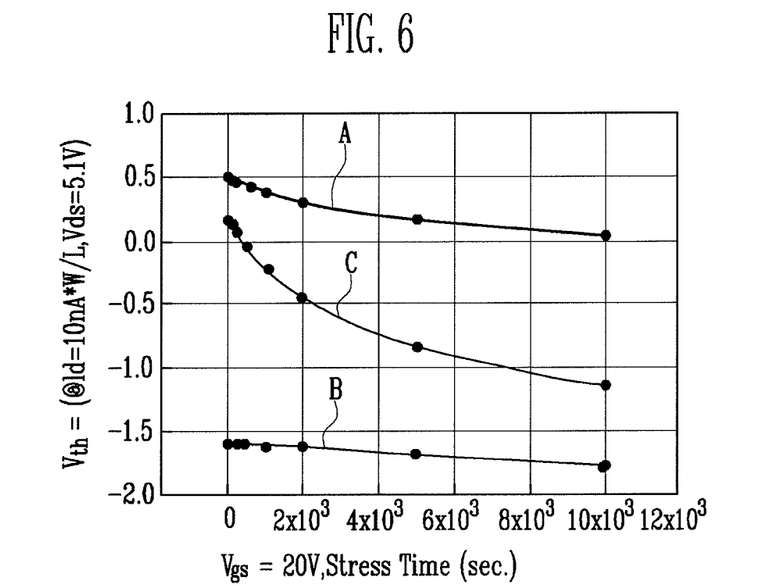
FIG. 6 is a graph illustrating changes in threshold voltage Vth with respect to time, measured by applying a stress voltage to a gate electrode.

FIG. 6 is a graph illustrating changes in threshold voltage Vth with respect to time, measured by applying a stress voltage (20V) to a gate electrode. Line A indicates the TFT (FIGS. 1A and 1B) in which the gate insulating layer 14 and the active layer 16 are interposed between the gate electrode 12 and the source and drain electrodes 20a and 20b. Line B indicates the TFT (FIGS. 5A and 5B) in which the protection layer 18 is overlapped with the edge portion of the source electrode 20a and the edge portion of the drain electrode 20b. Line C indicates a comparative TFT in which the active layer is not interposed between the gate electrode and the source and drain electrodes.

The threshold voltage Vth was decreased by about −0.44V in the case of the line A, by about −0.19V in the case of the line B and by about −1.3V in the case of the line C. Therefore, it can be seen that threshold voltage characteristics of the TFTs according to the embodiments are improved as compared with those of the comparative TFT. Particularly, although LTPS crystallized using the SPC method is used as an active layer, the TFTs of these embodiments have higher reliability and electrical characteristics as compared with the comparative TFT.

The TFT configured as described above can be applied to an organic light emitting display device.

Figure 7A:
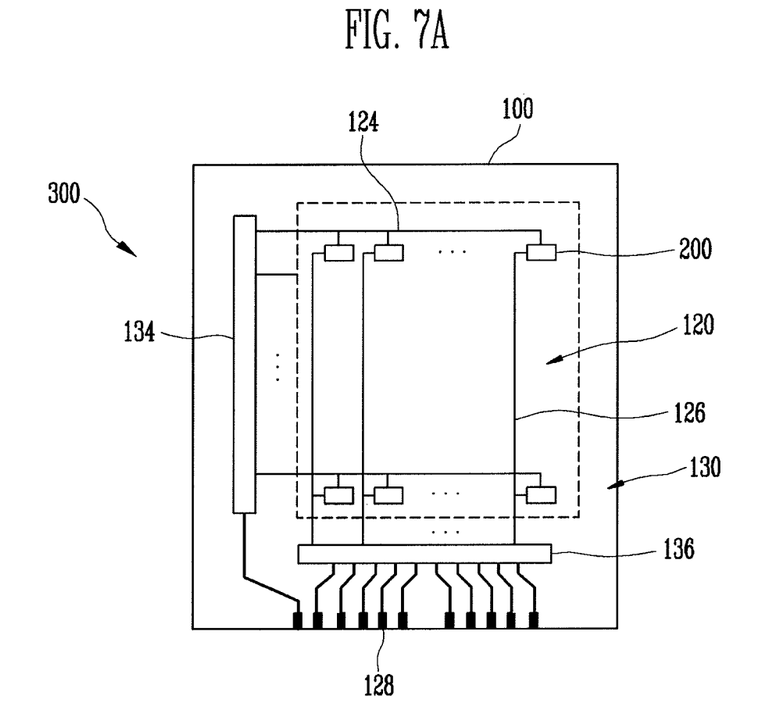
FIGS. 7A and 7B are plan and sectional views of an organic light emitting display device having a TFT according to an embodiment of the present invention.
Figure 7B:
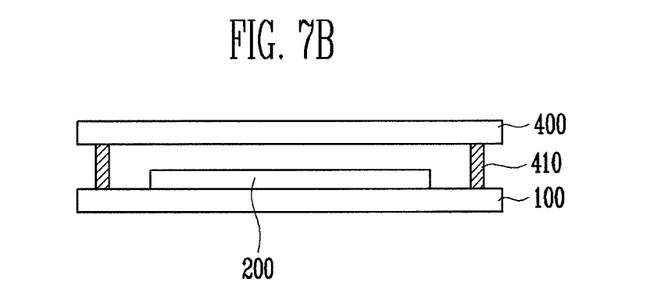

FIGS. 7A and 7B are plan and sectional views of an organic light emitting display device having a TFT according to an embodiment of the present invention. A display panel 300 for displaying images will be schematically described.

In one embodiment, as shown in FIG. 7A, a substrate 100 is defined by a pixel region 120 and a non-pixel region 130 formed around the pixel region 120. In one embodiment, in the pixel region of the substrate 100 are formed a plurality of organic light emitting elements 200 connected to one another in a matrix form between scan and data lines 124 and 126. In one embodiment, in the non-pixel region of the substrate 100 are formed i) scan and data lines 124 and 125 respectively extended from those in the pixel region 120, ii) a power supply line (not shown) for operating the organic light emitting elements 200, and iii) scan and data drivers 134 and 136 for processing signals provided from the exterior through pads 128 and supplying the processed signals to the scan and data lines 124 and 126.

Figure 8:
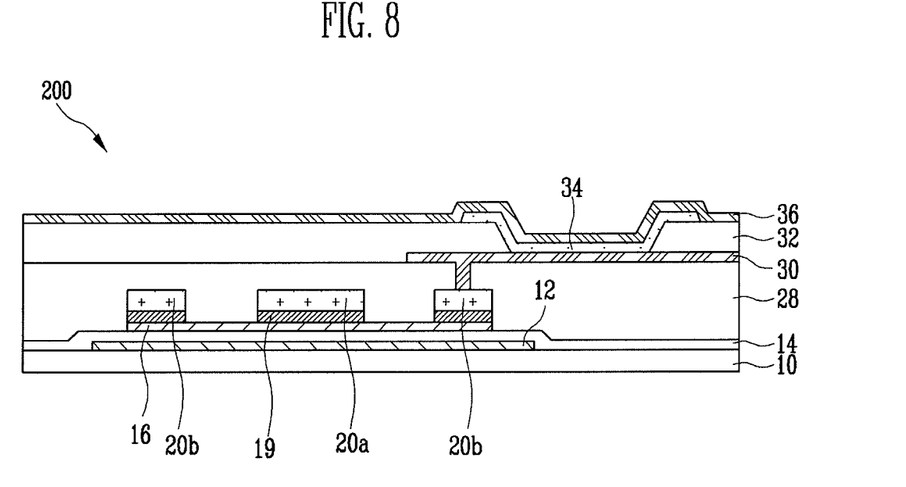
FIG. 8 is a sectional view of an organic light emitting display element of FIG. 7A.

FIG. 8 is a sectional view of an organic light emitting display element of FIG. 7A.

In one embodiment, as shown in FIG. 8, the organic light emitting element 200 includes an anode electrode 30, a cathode electrode 36, and an organic light emitting layer 34 formed between the anode and cathode electrodes 30 and 36. The organic light emitting layer 34 may further include a hole injection layer, a hole transport layer, an electron transport layer and an electron transport layer. The organic light emitting element 200 may further include a TFT for controlling the operation of the organic light emitting element 200 and a capacitor for maintaining signals.

The organic light emitting display element 200 having a TFT will be described in a more detailed manner with reference to FIGS. 7A and 8.

A gate electrode 12 may be formed on the substrate 10 (FIG. 8). A gate insulating layer 14 may be formed on the substrate 10 and the gate electrode 12, and an active layer 16 may be formed on the gate insulating layer 14 above the gate electrode 12. A source electrode 20a and a drain electrode 20b may be formed on or above the active layer 16. In one embodiment, the drain electrode 20b is formed to surround at least three surfaces of the source electrode 20a.

A planarization layer 28 may be formed on i) the source and drain electrodes 20a and 20b, ii) the gate insulating layer 14, iii) the active layer 16. A via hole may be formed in the planarization layer 28 so that at least one of the drain electrodes 20b is exposed. The anode electrode 30, connected to the drain electrode 20b through the via hole, may be formed on the planarization layer 28. A pixel defining layer 32 may be formed on the planarization layer 28 having the anode electrode 30 so that a region (light emitting region) of the anode electrode 30 is exposed. The organic light emitting layer 34 may be formed on the exposed anode electrode 30. The cathode electrode 36 may be formed on the pixel defining layer 32 having the organic light emitting layer 34.

In one embodiment, as shown in FIG. 7B, a sealing substrate 400 for sealing the pixel region 120 is disposed above the substrate 100 on which the organic light emitting element 200 is formed. The sealing substrate 400 may be joined with the substrate 100 by a sealing member 410, thereby completing the display panel 300.

In one embodiment, in an organic light emitting display device configured as described above, the light emitting characteristics and image quality of the organic light emitting element 200 can be improved by the TFT having enhanced reliability and output current characteristics.

According to at least one embodiment, since the area of surfaces of the drain electrode opposite to the source electrode is relatively broad, the number of electrons emitted from the drain electrode is larger than that of electrons injected into the source electrode, and the number of electrons injected into the source electrode is restricted. Thus, drain current is maintained constant in a saturation region, and accordingly, the TFT has stable output current characteristics.

Further, since the gate insulating layer and the active layer are interposed between the gate electrode and the source and drain electrodes, the TFT has a high reliability. Since the protection layer is formed on the active layer, it is possible to prevent damage of the active layer and electrical characteristics changed by contamination, thereby resulting in stable threshold voltage characteristics.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor (TFT) comprising:
    a substrate;
    a gate electrode formed on the substrate;
    a gate insulating layer formed on the substrate and the gate electrode;
    an active layer formed on the gate insulating layer;
    a protection layer formed on the active layer;
    a source electrode formed over the active layer, wherein the entire source electrode has a substantially linear shape; and
    a drain electrode formed to substantially surround at least three surfaces of the substantially linear source electrode on the active layer,
    wherein the protection layer has an opening and the source electrode spans across the opening in the protection layer.

2. The TFT according to claim 1, wherein the drain electrode has a "⊏" or "U" shape, and wherein the "⊏" or "U" shape surrounds a substantial portion of the source electrode.

3. The TFT according to claim 1, wherein the drain electrode comprises an edge portion, wherein the active layer comprises an edge portion, and wherein the edge portion of the drain electrode is substantially aligned with the edge portion of the active layer along a direction substantially perpendicular to the substrate.

4. The TFT according to claim 1, wherein the protection layer overlaps at least a portion of the source electrode and at least a portion of the drain electrode.

5. The TFT according to claim 1, wherein the protection layer overlaps with an edge portion of the source electrode and an edge portion of the drain electrode.

6. The TFT according to claim 1, further comprising an ohmic contact layer contacting and formed between the active layer and the drain electrode.

7. The TFT according to claim 6, wherein the ohmic contact layer is formed directly below the drain electrode.

8. The TFT according to claim 6, wherein the ohmic contact layer is formed directly below the source electrode.

9. The TFT according to claim 1, wherein the active layer is formed of low temperature poly silicon (LTPS) crystallized using a solid phase crystallization (SPC) method.

10. An organic light emitting display device comprising:
    a first substrate comprising an organic light emitting element and a thin film transistor (TFT) formed thereon, wherein the organic light emitting element comprises i) first and second electrodes and ii) an organic light emitting layer interposed between the first and second electrodes, and wherein the TFT is configured to control operations of the organic light emitting element; and
    a second substrate disposed opposite to the first substrate, wherein the TFT comprises:
    a gate electrode formed on the first substrate;
    a gate insulating layer formed on the first substrate and the gate electrode;
    an active layer formed on the gate insulating layer;
    a protection layer formed on the active layer;
    a source electrode formed over the active layer, wherein the entire source electrode has a substantially linear shape; and
    a drain electrode formed to substantially surround at least three surfaces of the substantially linear source electrode on the active layer,
    wherein the protection layer has an opening and the source electrode spans across the opening in the protection layer.

11. The organic light emitting display device according to claim 10, wherein the drain electrode has a "⊏" or "U" shape, and wherein the "⊏" or "U" shape surrounds a substantial portion of the source electrode.

12. The organic light emitting display device according to claim 10, wherein the drain electrode comprises an edge portion, wherein the active layer comprises an edge portion, and wherein the edge portion of the drain electrode is substantially aligned with the edge portion of the active layer along a direction substantially perpendicular to the substrate.

13. The organic light emitting display device according to claim 10, wherein the protection layer overlaps at least a portion of the source electrode and at least a portion of the drain electrode.

14. The organic light emitting display device according to claim 13, wherein the protection layer overlaps with an edge portion of the source electrode and an edge portion of the drain electrode.

15. The organic light emitting display device according to claim 10, further comprising an ohmic contact layer formed between the active layer and the drain electrode.

16. An organic light emitting display device comprising:
a first substrate;
a second substrate disposed opposite to the first substrate;
an organic light emitting element formed between the first and second substrates;
a gate electrode formed over the first substrate;
a gate insulating layer formed over the first substrate and the gate electrode;
an active layer formed on the gate insulating layer;
a protection layer formed on the active layer;
a source electrode formed over the active layer, wherein the entire source electrode has a substantially linear shape; and
at least two drain electrodes spaced apart from the source electrode and formed on opposite sides of the source electrode, wherein at least one of the drain electrodes substantially surrounds at least three surfaces of the substantially linear source electrode, and wherein two of the three surfaces are opposing each other,
wherein the protection layer has an opening and the source electrode spans across the opening in the protection layer.

17. The organic light emitting display device according to claim 16, further comprising: a planarization layer covering i) the source electrode, ii) the drain electrodes, iii) the active layer and iv) the gate insulating layer, wherein a via hole is defined in the planarization layer, and wherein the organic light emitting element is electrically connected to at least one of the drain electrodes through the via hole.

18. The TFT according to claim 1, wherein the protection layer has a "⊏" or "U" shape and wherein the "⊏" or "U" shape surrounds a substantial portion of the source electrode.

* * * * *